United States Patent
Vaufrey (10) Patent No.: US 10,490,700 B2
(45) Date of Patent: Nov. 26, 2019

(54) LIGHT-EMITTING DIODE COMPRISING A STACK WITH A THINNED PART, AND METHOD FOR DEVELOPING THE LIGHT-EMITTING DIODE

(71) Applicant: Commissariat a l'energie atomique et aux energies alternatives, Paris (FR)

(72) Inventor: David Vaufrey, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 16/037,430

(22) Filed: Jul. 17, 2018

(65) Prior Publication Data
US 2019/0019918 A1 Jan. 17, 2019

(30) Foreign Application Priority Data
Jul. 17, 2017 (FR) ...................... 17 56778

(51) Int. Cl.
*H01L 33/38* (2010.01)
*H01L 33/24* (2010.01)
(Continued)

(52) U.S. Cl.
CPC ........ *H01L 33/382* (2013.01); *H01L 33/0062* (2013.01); *H01L 33/0075* (2013.01); *H01L 33/14* (2013.01); *H01L 33/20* (2013.01); *H01L 33/24* (2013.01); *H01L 33/30* (2013.01); *H01L 33/32* (2013.01); *H01L 33/38* (2013.01);
(Continued)

(58) Field of Classification Search
CPC ...................................... H01L 33/24
See application file for complete search history.

(56) References Cited

U.S. PATENT DOCUMENTS 4,053,914 A * 10/1977 Goodwin ................ H01L 33/00
257/103
4,700,210 A 10/1987 Burton et al.
(Continued)

FOREIGN PATENT DOCUMENTS

EP 2 846 366 A1 3/2015
JP 07-086635 3/1995

OTHER PUBLICATIONS

Baets, R.G., et al., "Resonant-Cavity Light-Emitting Diodes: a review", Light-Emitting Diodes: Research, Manufacturing, and Applications VII, Proceedings of SPIE. vol. 4996, 2003, pp. 74-86.
(Continued)

*Primary Examiner* — Yu-Hsi D Sun
(74) *Attorney, Agent, or Firm* — Oblon, McClelland, Maier & Neustadt, L.L.P.

(57) ABSTRACT

A light-emitting diode includes a stack of semiconductor layers including a first face and a second face that are opposite one another relative to a thickness of the stack, a first electrode including a face in contact with the first face of the stack, and a second electrode in contact with the stack. Moreover, the light-emitting diode is such that a recess is formed in the second face of the stack which results in the stack including a thinned part, the face of the first electrode in contact with the first face is in contact only with the thinned part of the stack, and the second electrode is in contact with a zone of the stack separate from the thinned part of the stack.

13 Claims, 4 Drawing Sheets

(51) Int. Cl.
*H01L 33/00* (2010.01)
*H01L 33/14* (2010.01)
*H01L 33/30* (2010.01)
*H01L 33/32* (2010.01)
*H01L 33/20* (2010.01)
*H01L 33/06* (2010.01)
*H01L 33/40* (2010.01)
*H01L 33/10* (2010.01)
*H01L 33/46* (2010.01)

(52) U.S. Cl.
CPC ............ *H01L 33/06* (2013.01); *H01L 33/105* (2013.01); *H01L 33/40* (2013.01); *H01L 33/46* (2013.01); *H01L 2933/0016* (2013.01)

(56) References Cited

U.S. PATENT DOCUMENTS

| | | | | |
|---|---|---|---|---|
| 4,706,101 | A * | 11/1987 | Nakamura | H01L 33/0062 257/95 |
| 4,990,972 | A | 2/1991 | Satoh et al. | |
| 6,541,799 | B2 * | 4/2003 | Udagawa | H01L 33/0066 257/190 |
| 2002/0047131 | A1 | 4/2002 | Ludowise et al. | |
| 2002/0113235 | A1 | 8/2002 | Udagawa | |
| 2012/0037885 | A1 | 2/2012 | Schardt et al. | |
| 2015/0069443 | A1 | 3/2015 | Reboud et al. | |

OTHER PUBLICATIONS

French Preliminary Search Report dated Apr. 9, 2018 in French Application 17 56778 filed on Jul. 17, 2017 (with English Translation of Categories of Cited Documents and Written Opinion).
Christopher Wiesmann, et al., "Photonic crystal LEDs—designing light extraction," Laser & Photonics Reviews 3, No. 3, 2009, pp. 262-286.
Dae-Seob Han, et al., "Improvement of Light Extraction Efficiency of Flip-Chip Light-Emitting Diode by Texturing the Bottom Side Surface of Sapphire Substrate," IEEE Photonics Technology Letters, vol. 18, No. 13, Jul. 2006, pp. 1406-1408.
Day-Shan Liu, et al., "Light-extraction enhancement in GaN-based light-emitting diodes using grade refractive-index amorphous titanium oxide films with porous structures," Applied Physics Letters 94, 2009, pp. 143502-1-143502-3.
X. H. Wang, et al., "Evaluation of InGaN/GaN light-emitting diodes of circular geometry," Optics Express, vol. 17, No. 25, Dec. 2009, 9 Pages.
T. Fujii, et al. "Increase in the extraction efficiency of GaN-based light-emitting diodes via surface roughening," Applied Physics Letters, vol. 84, No. 6, Feb. 2004, pp. 1-4.
W N Ng, et al. "Photonic crystal light-emitting diodes fabricated by microsphere lithography," Nanotechnology 19, 2008, pp. 1-6.

* cited by examiner

Figure 11

LIGHT-EMITTING DIODE COMPRISING A STACK WITH A THINNED PART, AND METHOD FOR DEVELOPING THE LIGHT-EMITTING DIODE

FIELD OF THE INVENTION

The field of the invention relates to light-emitting diodes, notably based on inorganic semiconductors.

PRIOR ART

The efficiency of a light-emitting diode is able to be improved by modifying various features thereof.

For example, it is known to implement texturing forming roughness on an emission surface of a layer of GaN (gallium nitride) with n-type doping of a stack of a light-emitting diode, as taught by the document 'Increase in the extraction efficiency of GaN-based light-emitting diodes via surface roughening' by T. Fujii et al. published in Applied Physics Letters volume 84, number 6, 9 Feb. 2004 on pages 855 to 857. Such texturing makes it possible to limit light reflections inside the stack, and to diffuse this light towards the outside of the stack.

Although the texturing of the light-emitting diode makes it possible to improve the extraction of the photons, it is confined to improving the extraction of the photons that reach the emission surface. In this sense, it is understood that there is a need to improve the quantity of photons that reach the emission surface of the light-emitting diode.

The document 'Evaluation of InGaN/GaN light-emitting diodes of circular geometry' by X. H. Wang et al. published in Optics Express Vol. 17, issue 25 pp. 22311-22319 (2009) describes that the shape of a light-emitting diode may have an influence on the extraction of the light generated by the light-emitting diode. Specifically, in a stack of a light-emitting diode, photons may be generated, preferably by quantum wells, and then propagate in different directions. According to this document, the upwards extraction may be performed via emissions of photons taking place at an associated solid angle, and when the photons are emitted outside of this solid angle, they may escape via the sides of the light-emitting diode, or may be reflected within the light-emitting diode. In short, without a particular measure aimed at improving the extraction of the light-emitting diode, only those photons emitted at a particular solid angle are taken into account when calculating the efficiency of the light-emitting diode if this efficiency of the light-emitting diode is measured for one side, generally upwards or for the 'top surface'. It is understood that there is also a need to improve the efficiency of the light-emitting diode, notably by increasing the extraction of the photons emitted by the light-emitting diode, in particular from one and the same side of the light-emitting diode.

In this sense, it is clearly understood that there is a need to develop a novel light-emitting diode structure that responds to the general problem of improving the efficiency of the light-emitting diode, notably by optimizing the optical extraction of the light-emitting diode.

OBJECT OF THE INVENTION

The aim of the invention is to meet all or some of the needs mentioned above.

To tend towards this aim, one object of the invention is a light-emitting diode comprising:

a stack of semiconductor layers comprising a first face and a second face that are opposite one another relative to a thickness of the stack, a first electrode comprising a face in contact with the first face of the stack, and a second electrode in contact with the stack, the light-emitting diode is characterized in that:

a recess is formed in the second face of the stack which results in that the stack comprises a thinned part, the face of the first electrode in contact with the first face is in contact only with the thinned part of the stack, the second electrode is in contact with a zone of the stack separate from said thinned part of the stack.

This makes it possible notably to improve the efficiency of the extraction of the light-emitting diode while at the same time retaining appropriate spatial distribution of the current within the light-emitting diode during operation.

The light-emitting diode may comprise one or more of the following features:

the recess delimits said thinned part of the stack with a part of the first face, and the face of the first electrode in contact with the thinned part of the stack has an area smaller than or equal to the area of said part of the first face;

the stack comprises an active region able to generate photons, a layer of semiconductor material with doping of a first type and a layer of semiconductor material with doping of a second type, the recess being formed in the layer of semiconductor material with doping of a first type that has an electrical conductivity strictly greater than the electrical conductivity of the layer of semiconductor material with doping of a second type;

the stack has a first thickness between its first and second faces and a second thickness d between a bottom of the recess and the first face, the second thickness d being strictly less than the first thickness, the second thickness d satisfying the following equation:

$$d = z + L$$

where $$z = k_z \cdot \frac{\lambda}{2n}, \quad d = k_d \cdot \frac{\lambda}{2n},$$

and L being such that $$\frac{\lambda}{2n} \cdot (k_d - k_z) = L$$

where $k_d > k_z$, $k_d$ and $k_z$ being positive integers other than 0, $\lambda$ being a main emission wavelength during operation of the light-emitting diode, and n being an optical index of the stack determined at the main emission wavelength;

$k_z$ is strictly greater than 1 and strictly less than 6, $k_d$ is strictly less than 10, and $k_z$ is such that the layer of semiconductor material with doping of a second type has, within the thinned part, a thickness greater than or equal to 50 nm, and $k_d$ is such that the layer of semiconductor material with doping of a first type has, between the bottom of the recess and a face of said layer of semiconductor material with doping of a first type, which face is oriented towards the layer of semiconductor material with doping of a second type, a thickness greater than or equal to 100 nm;

the thinned part of the stack comprises:
  a first part linking the first electrode to a zone located in the active region of the stack, the first part having a thickness equal to z,
  a second part extending from the first part to the bottom of the recess, the second part having a thickness equal to L;
the active region comprises a plurality of active layers, each allowing the recombination of charge carriers, and the zone located in the active region is located in the active layer closest to the first electrode;
the recess is delimited by an aperture of the recess, which aperture is formed in the second face, a bottom of the recess and a wall of the recess linking the bottom to the aperture;
the aperture has dimensions smaller than the dimensions of the recess as measured in a plane located between the aperture and the bottom of the recess, and the aperture has an area greater than or equal to that of said face of the first electrode;
the wall comprises, in a sectional plane perpendicular to the bottom, a concave profile;
the light-emitting diode has a current spreading length and, orthogonally to a stacking direction of the semiconductor layers of the stack, the recess has a dimension comprised between once and five times the current spreading length of the light-emitting diode.

Another object of the invention is a method for developing a light-emitting diode, said light-emitting diode to be developed comprising:
  a stack of semiconductor layers comprising a first face and a second face that are opposite one another relative to a thickness of the stack,
  a first electrode comprising a face in contact with the first face of the stack, and
  a second electrode,
and the development method comprises a step of designing the stack whose second face has a recess so as to form a thinned part of the stack, the step of designing taking into account the following features:
  said face of the first electrode of the light-emitting diode is intended to be in contact only with the thinned part of the stack,
  the second electrode of the light-emitting diode is intended to be in contact with a zone of the stack separate from said thinned part of the stack.

The development method may comprise one or more of the following features:
  the step of designing the stack comprises the following steps:
    a step of determining a main emission wavelength λ of the light-emitting diode during operation thereof,
    a step of determining, at the main emission wavelength, an optical index n of the stack,
    a step of determining a thickness d of the thinned part between the first face and a bottom of the recess, the thickness d satisfying d=z+L where $$z = k_z \cdot \frac{\lambda}{2n}, \quad d = k_d \cdot \frac{\lambda}{2n},$$

and L being such that $$\frac{\lambda}{2n} \cdot (k_d - k_z) = L$$

where $k_d > k_z$, $k_d$ and $k_z$ being positive integers other than 0;
  the step of determining the thickness d comprises a step of choosing the value of $k_z$, $k_z$ having to be strictly greater than 1 and strictly less than 6, and a step of choosing the value $k_d$, $k_d$ having to be strictly less than 10;
  the step of designing the stack comprises a step of determining a current spreading length of the light-emitting diode, and a step of dimensioning the recess such that, orthogonally to a stacking direction of the semiconductor layers of the stack, said recess has a dimension comprised between once and five times the current spreading length of the light-emitting diode.

BRIEF DESCRIPTION OF THE DRAWINGS

The invention will be better understood upon reading the following description, given solely by way of nonlimiting example and made with reference to the figures, in which.

In these figures, the same references are used to denote the same elements.

Moreover, the various elements shown in the figures are not necessarily shown to a uniform scale, so as to make the figures more legible.

DESCRIPTION OF SPECIFIC EMBODIMENTS

In the context of the present invention, it is sought, preferably, to produce a light-emitting diode (LED) whose structure tends to concentrate photons emitted from an active region of a stack of semiconductor layers of the light-emitting diode, notably via quantum wells, within a solid angle at which the emitted photons escape via an upper emission surface, or more generally an emission surface of the light-emitting diode. This emission surface may be located on a side of the light-emitting diode opposite an anode of the light-emitting diode for an LED based on GaN (gallium nitride) or AlGaN (aluminium gallium nitride). To optimize the operation of the LED, a first electrode may be in contact with a charge-carrier transport layer of the stack having a first electrical conductivity, while a second electrode may be in contact with another charge-carrier transport layer of the stack having a second electrical conductivity strictly greater than the first electrical conductivity. Notably, the contact surface of the first electrode with the stack is strictly larger than the contact surface of the second electrode with the stack. Such a structure may be achieved by limiting the thickness of part of the stack that then comprises the emission surface.

To respond to the problem of improving the efficiency of the extraction of the light-emitting diode, it is proposed to limit the thickness of part of the stack, while at the same time retaining appropriate spatial distribution of the current within the light-emitting diode during operation.

A light-emitting diode is a device that makes it possible to generate electromagnetic waves, which are for example centred on a particular wavelength, or light in the visible or non-visible spectrum. In other words, a light-emitting diode is configured to emit photons. Preferably, the proposed thinning expediently makes it possible to take account of the interference between the direct emitted electromagnetic waves and the electromagnetic waves reflected on the first electrode, as well as interference between the electromagnetic waves emitted within the stack and brought about by the optical cavity of the light-emitting diode, for the purpose of improving the extraction of the photons, and therefore the efficiency of the light-emitting diode. The extraction efficiency of a light-emitting diode may be seen as the number of photons leaving the light-emitting diode with respect to the number of photons generated in the light-emitting diode. Moreover, retaining the appropriate spatial distribution of the current is for its part implemented by a specific arrangement of the electrical contacts (anode and cathode) that is suited to the constraints imposed by the constructive interference conditions, and therefore by the presence of this thinned part of the stack.

In the present description, when reference is made to a main emission wavelength of the light-emitting diode (also called main emission wavelength during operation of the light-emitting diode or main emission wavelength of the light-emitting diode during operation thereof), this is the wavelength of the maximum of the electroluminescence spectrum of the light-emitting diode.

In FIGS. 1 to 10, a three-dimensional orthogonal system is shown with axes X, Y, Z, the axes X, Y and Z being orthogonal to one another and extending from one and the same origin. The axes X and Y define a plane considered to be parallel to the horizontal of the reference frame of the light-emitting diode 1. The axis Z is directed upwards, and makes it possible to show a vertical direction of the light-emitting diode 1. Notably, the axis Z is orthogonal to the plane of emission of the light-emitting diode 1, that is to say to the plane via which the photons emitted by the light-emitting diode 1 escape. It is notably with respect to this vertical direction that the terms 'above' and 'plumb with' may be interpreted. FIGS. 1, 3, 5, 6, 7, 8, 9 and 10 are sectional views along a sectional plane parallel to the plane defined by the axes X and Z.

In the present description, the stack of semiconductor layers of the light-emitting diode 1 is associated with a stacking direction that corresponds to the axis along which the semiconductor layers of the stack are stacked. The concept of thickness used in the present description is linked to the axis Z, and is measured along an axis parallel to the axis Z, that is to say along an axis parallel to the stacking direction of the semiconductor layers of the stack of layers.

In the present description, the wording 'A based on B' is understood to mean that B features predominantly in the composition of A.

In the present description, an emission surface corresponds to a surface of the stack of semiconductor layers of the light-emitting diode via which the photons generated within the stack escape. This emission surface is located on one side of the light-emitting diode, also called emission face of the light-emitting diode, and makes it possible to define the plane of emission mentioned above.

The notion of interference between the direct emitted electromagnetic waves and the indirect emitted electromagnetic waves (those that are reflected) is a notion known to those skilled in the art under the term 'Lloyd's mirror', which describes a phenomenon of interference between a photon-emitting point source and a mirror. Considering the mirror to be the first electrode, and the point source to be the photon-emitting location closest to the mirror, adjusting the separating distance between the mirror and the point source may make it possible to generate constructive interference for the purpose of optimizing the extraction of these waves from the stack of the light-emitting diode via the emission surface, which is notably located plumb with the first electrode.

The notion of interference brought about by the cavity is known to those skilled in the art, notably according to the principle of the Fabry-Perot interferometer. The optical cavity in the context of the stack of the light-emitting diode may be constituted by all of the parts of the stack that are located plumb with the first electrode.

By studying these two interference notions and the expressions of the optical path differences that result therefrom, it may be concluded that these two types of interference may be optimized independently of one another, but that the combination thereof acts synergistically so as to improve the extraction efficiency of the light-emitting diode. However, it is seen that the optimization leads to a reduction in the usual thickness of the stack of semiconductor layers of the light-emitting diode, notably through a reduction in the thickness of a hole transport layer and of an electron transport layer of the stack. The reduction in the thickness mentioned above makes it possible to improve the extraction efficiency of the photons that are generated, but this is at the expense of the spatial distribution of the current in the stack when the light-emitting diode is operating: the result of this is that the charge carriers are concentrated in the zones closest to the electrodes. As a result, a significant part of the active region of the stack able to generate photons is not or is only slightly flowed through by a current able to generate the photons. In fact, numerous light-emitting diodes suffer from efficiency drop at a high injection: as a result, it is always desirable to homogenize the current flowing through the LED.

In this sense, the present invention proposes a novel light-emitting diode structure that makes it possible notably to improve the photon extraction efficiency at the level of one and the same side of the light-emitting diode. Such a structure may be implemented by the stack of semiconductor layers with a thinned part, and by expedient cooperation of the electrodes of the light-emitting diode with this stack of semiconductor layers. In particular, it is proposed for the stack to comprise a thinned part in contact with an anode, for example in the case of an LED based on GaN, or in contact with a cathode, for example in the case of an LED based on InP, and to position the cathode (LED based on GaN), or where applicable the anode (for example LED based on InP), outside of the thinned part in order to improve the distribution of the current during operation of the light-emitting diode.

Figure 1:
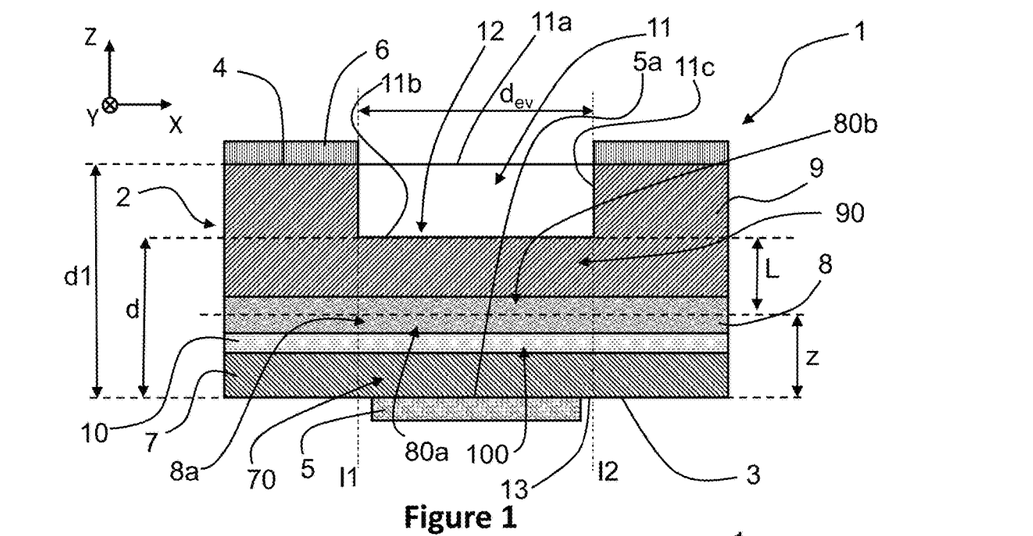
FIG. 1 illustrates a sectional view of a light-emitting diode according to one particular embodiment of the invention.

As illustrated in FIG. 1, the light-emitting diode 1 comprises the stack 2 of semiconductor layers. This stack 2 of semiconductor layers comprises a first face 3 and a second face 4. Notably, these semiconductor layers are inorganic. The semiconductor layers of the stack 2 may each comprise a material chosen from the III-V and II-VI materials. The stack 2 of semiconductor layers has a thickness, notably given by the sum of the thicknesses of the stacked semiconductor layers of said stack 2. The first and second faces 3, 4 are opposite one another relative to the thickness of the stack 2, that is to say that they are oriented in opposite directions, and notably formed at least partly in planes that are parallel to one another and orthogonal to the stacking direction of the semiconductor layers of the stack 2 parallel to the axis Z. The stacking direction of the semiconductor layers of the stack 2 is orthogonal to the planes of the semiconductor layers of the stack 2. In other words, the semiconductor layers of the stack 2 are stacked between the first and second faces 3, 4. The light-emitting diode 1 also comprises the first electrode 5 comprising a face 5*a* in contact with the first face 3 of the stack 2, and the second electrode 6 in contact with the stack 2.

The first electrode 5 may be an anode, or a cathode, and the second electrode 6 of opposite type to the first electrode 5 may be a cathode, or an anode. The first and second electrodes 5, 6 may be metallic, and may each have a thickness comprised between a few nanometres and 5 µm. For example, the first and second electrodes 5, 6 may comprise at least one material chosen from nickel, silver, platinum, titanium, aluminium and gold. The first and second electrodes 5, 6 may be formed by multilayers of electrically conductive materials whose resistivity is preferably less than $10^{-3}$ ohms centimetres. Notably, each of the first and second electrodes 5, 6 has an electrical conductivity greater than that of the semiconductor layer of the stack 2 with which it is in contact, for example by a factor of 10, 100 or 1000.

Conventionally, the anode makes it possible to inject holes into the stack 2 and the cathode makes it possible to inject electrons into the stack 2. In this sense, the face 5*a* of the first electrode 5 in contact with the first face 3 is also called, where applicable, hole injection face or electron injection face. The face 5*a* is oriented towards the active region 8 of the stack 2. In particular, the injection face 5*a* of the first electrode 5 is parallel to the first face 3, and is orthogonal to the stacking direction.

Preferably (FIG. 1), the stack 2 comprises a layer 9 of semiconductor material with doping of a first type (notably in contact with the second electrode 6) and a layer 7 of semiconductor material with doping of a second type (notably in contact with the first electrode 5). The first type and the second type are opposite to one another and are chosen from n and p. When the doping is p-type, the p-doped layer is in contact with the anode, which injects holes into said layer of semiconductor material with p-type doping when the light-emitting diode 1 is operating. When the doping is n-type, the n-doped layer is in contact with the cathode, which injects electrons into said layer of semiconductor material with n-type doping when the light-emitting diode 1 is operating. The layer 9 of semiconductor material with doping of a first type and the layer 7 of semiconductor material with doping of a second type are charge-carrier transport layers, where applicable hole transport layers if the doping is p-type or electron transport layers if the doping is n-type. The stack 2 also comprises the active region 8 within which it is possible to recombine charge carriers for the purpose of generating photons. A charge carrier may be an electron or a hole. The active region 8 is able to generate photons. In particular, the active region 8 is arranged/located between the layer 7 of semiconductor material with doping of a second type and the layer 9 of semiconductor material with doping of a first type. The active region 8 may be a spacer region located between the layer of n-doped material and the layer of p-doped material. The active region 8 may also be the simple junction of the layers of semiconductor material with doping of a first type and of semiconductor material with doping of a second type (p-n junction), or may be a layer of the stack 2 that may comprise a single semiconductor layer (p-i-n junction for p-doped intrinsic n-doped) or a plurality of semiconductor layers, as will be seen hereinafter. The active region 8 may be in contact with the layer 9 of semiconductor material with doping of a first type, and in contact with the layer 7 of semiconductor material with doping of a second type. The thickness of the active region 8 may be adapted by those skilled in the art according to requirements. According to one variant, the stack 2 may comprise a charge-carrier blocking layer 10 of semiconductor material arranged between the active region 8 and the layer 7 of semiconductor material with doping of a second type. In this case, the blocking layer 10 is in contact with the layer 7 of semiconductor material with doping of a second type and the active region 8, and is able to block the electrons if the second type is p-type, or block the holes if the second type is n-type.

According to a first example, the material of the layers 7, 9 of semiconductor material with doping of a first type and of semiconductor material with doping of a second type may comprise—or be based on—a semiconductor material such as for example gallium nitride (GaN). In this first example, the second type is p-type, and the layer 7 of semiconductor material with doping of a second type may comprise gallium nitride doped with magnesium. In this first example, the first type is n-type, and the layer 9 of semiconductor material with doping of a first type may comprise gallium nitride doped with silicon. According to this first example, the first electrode 5 is the anode.

According to a second example, the material of the layers 7, 9 of semiconductor material with doping of a first type and of semiconductor material with doping of a second type may comprise—or be based on—a semiconductor material such as for example indium phosphide (InP). In this second example, the second type is n-type, and the layer 7 of semiconductor material with doping of a second type may comprise indium phosphide doped with sulfur or with tin. In this second example, the first type is p-type, and the layer 9 of semiconductor material with doping of a first type may comprise indium phosphide doped with zinc. According to this second example, the second electrode 6 is the anode.

In the present description, when reference is made to doping, this is electrical doping: impurities have been added to a pure substance or one that is desired to be pure (in the example the GaN or the InP) in order intentionally to modify its electrical conductivity properties.

Figure 2:
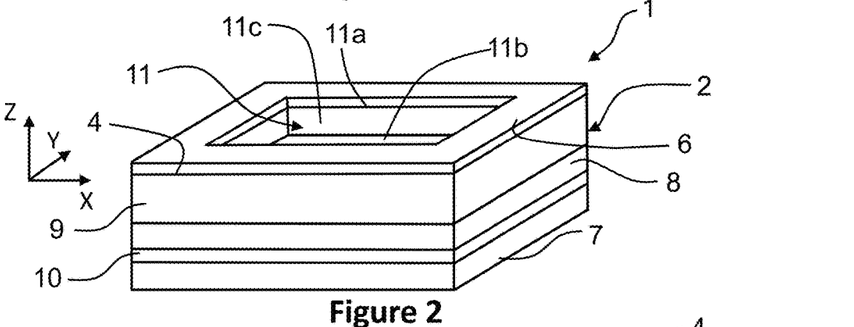
FIG. 2 is a perspective view of the light-emitting diode of FIG. 1.

Generally, always illustrated in FIG. 1, a recess 11 is formed in the second face 4 of the stack 2 which results in that the stack 2 comprises a thinned part 12. The recess 11 is notably such that it is formed in one of the semiconductor layers of the stack 2 so as to have a depth that is strictly less than the maximum thickness of said layer in which it is formed; the recess 11 may then be formed by localized thinning of one of the semiconductor layers of the stack 2. The recess 11 is notably formed in the layer 9 of semiconductor material with doping of a first type that has an electrical conductivity strictly greater than the electrical conductivity of the layer 7 of semiconductor material with doping of a second type: this makes it possible locally to reduce the thickness of the stack for the purpose of ensuring appropriate distribution of the current during operation of the light-emitting diode. Notably, the recess 11 is formed such that part of the layer 9 of semiconductor material with doping of a first type remains between a bottom of the recess 11 and the active region 8. Thus, the thinned part 12 of the stack 2 may be such that it comprises a portion of each of the semiconductor layers of the stack 2. This thinned part 12 of the stack 2 therefore extends from the recess 11 to the first face 3. It is then said that the stack 2 comprises the recess 11. Thus, the recess 11 may be delimited by an aperture 11a of the recess formed/made in the second face 4, the bottom 11b of the recess 11 and a wall 11c of the recess 11 linking the bottom 11b to the aperture 11a. The bottom 11b and the wall 11c may correspond to surfaces of the layer 9 of semiconductor material with doping of a first type. The bottom 11b may be flat. The wall 11c extends notably from the bottom 11b so as, for example, to form a straight hollow cylinder. It is said notably that the recess 11 is a non-through hole, that is to say a blind hole, formed in the second face 4, in particular in the layer 9 of semiconductor material with doping of a first type (FIG. 2). It is in this sense that FIG. 2 schematically illustrates the light-emitting diode 1 comprising the recess 11 whose wall 11c that links the bottom 11b to the aperture 11a of the recess comprises four sides perpendicular to the bottom 11b and perpendicular to one another in pairs, so as to form a frame. The recess 11, in the sense of the present description, is not a simple surface roughness.

According to one embodiment, for example illustrated in FIG. 1, the recess 11 delimits said thinned part 12 with a part 13 of the first face 3. In this case, the part 13 of the first face 3 has an area strictly smaller than the area of the first face 3. In particular, it is said that the recess 11 makes it possible to delimit one side of the thinned part of the stack 2, and that the part 13 of the first face 3 delimits another side of the thinned part of the stack 2. Worded another way, the thinned part extends from the part 13 of the first face 3 to the recess 11. The thinned part 12 of the stack 2 makes it possible to form an optical cavity in the stack 2, which cavity is adapted to a main emission wavelength of the light-emitting diode 1. Notably, it is said that the thinned part 12 of the stack 2 comprises the first part 13 of the first face 3 and a surface of the stack 2 that contributes to delimiting the recess 11. In particular, the first face 3, or at least the part 13 of the first face 3, is planar and, for any point of the part 13 of the first face 3, there is a straight line passing through said point and perpendicular to the part 13 of the first face 3 such that said straight line passes through the recess 11. Preferably, any point of the first electrode 5 may be projected orthogonally in a plane orthogonal to the stacking direction of the semiconductor layers of the stack 2 and passing through the recess 11, notably passing through the aperture 11a of the recess 11, such that all of the points projected from the first electrode 5 are projected in a zone of the plane included in the recess 11 so as to promote the recombination of charge carriers within the thinned part 12.

The thinning of the stack 2 makes it possible to accentuate the constructive interference described above for the purpose of improving the emission of photons by the light-emitting diode 1, notably from the top of the thinned part 12 of the stack opposite the first face 3. Thus, the emission surface of the light-emitting diode 1 is notably formed by the surface of the stack 2 (or at least part of this surface of the stack 2) that contributes to delimiting the recess 11. The emission face of the light-emitting diode 2 is therefore on the side of the second face 4.

The face 5a of the first electrode 5 in contact with the first face 3 of the stack 2 is in contact only with the thinned part 12 of the stack 2. In FIG. 1, the face 5a of the first electrode 5 is in contact only with the part 13 of the first face 3. This makes it possible to localize the recombination of the charge carriers (holes and electrons) in the thinned part 12 of the stack 2, that is to say in at least part of the active region 8 located in the thinned part 12, when the light-emitting diode is operating.

Preferably, the face 5a of the first electrode 5 in contact only with the thinned part 12 of the stack 2, and therefore where applicable only with the part 13 of the first face 3, has an area smaller than or equal to the area of said part 13 of the first face 3. This allows better efficiency of the light-emitting diode 1 in the sense that the layer 7 of semiconductor material with doping of a second type has a conductivity such that the current lines inside it are generally vertical, that is to say parallel to the stacking direction of the semiconductor layers of the stack 2. The probabilities of recombination of the charge carriers will thus be concentrated in the thinned part 12 of the stack 2, notably within a part 8a (FIG. 1) of the active region 8 located in the thinned part 12 of the stack 2. In fact, it is within the part 8a of the active region 8 that the majority of the charge carriers recombine. It is then understood that only a negligible portion of the charge carriers may recombine in the active region 8 outside of the thinned part 12 of the stack 2. The fact that the area of the part 13 of the first face 3 is smaller than the area of the first face 3 makes it possible for example to avoid a problem, notably linked to 'quenching', in the event of etching of the layer 7 of semiconductor material with doping of a second type.

Figure 3:
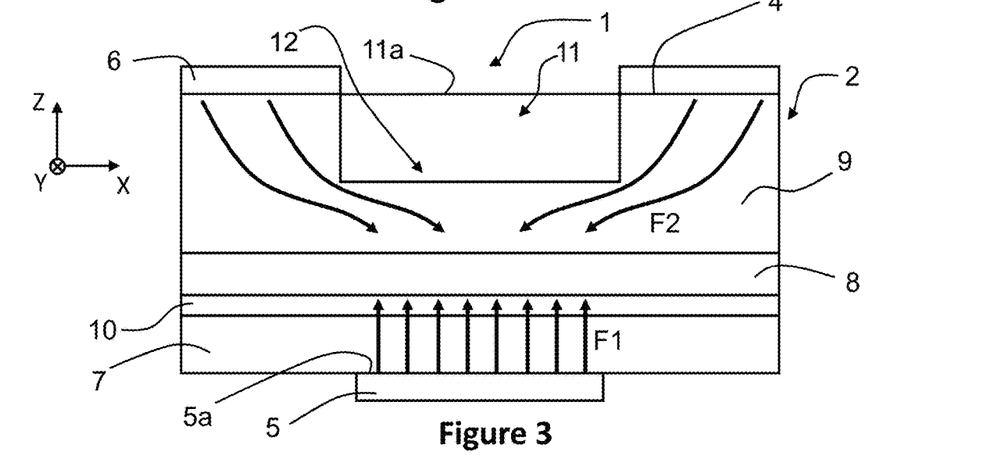
FIG. 3 is a sectional view of the light-emitting diode of the type of FIG. 1, in which the hatching has been removed so as to reveal current lines.
Figure 4:
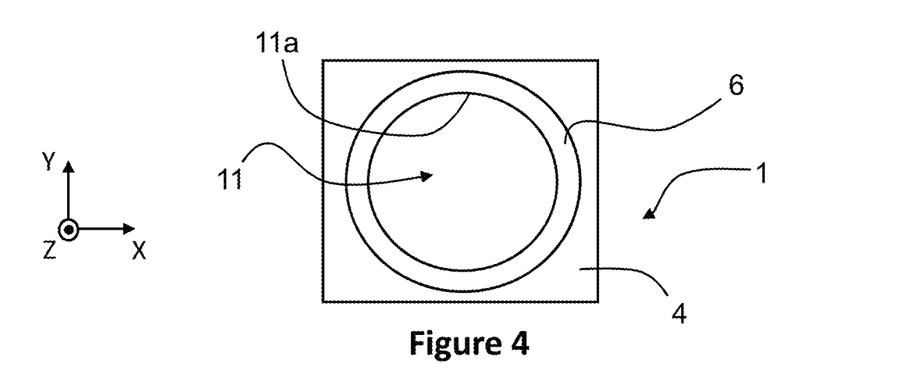
FIG. 4 illustrates an alternative embodiment of the light-emitting diode seen from above.

FIG. 3 is a simplified version of FIG. 1, in which the hatching has been removed so as to reveal the current lines (arrows F1) in the layer 7 of semiconductor material with doping of a second type between the first electrode 5 and the active region 8. In the field, it is generally said that the shadow of the first electrode 5 in the active region 8 characterizes the predominant region of recombination of the charge carriers. The shadow of the first electrode 5 in the active region 8 is notably such that each point of the active region 8 shadowed by the first electrode 5 may be projected orthogonally onto the face 5a of the first electrode 5.

Moreover, the second electrode 6 is in contact with a zone of the stack 2 separate from said thinned part 12 of the stack 2 (FIG. 1). Thus, the second electrode 6 is notably not in contact with the thinned part 12; the second electrode 6 may then be at a distance from the thinned part 12. This zone of the stack 2 corresponds notably to an outer surface of the stack 2. This makes it possible to allow the emission of photons from the thinned part 12 of the stack 2 on the side of the second face 4 without the second electrode 6 impeding this emission through the top of the thinned part 12, on the one hand, and to improve the distribution of the current in the light-emitting diode 1 by increasing the current spreading length (or "the spreading length") of the light emitting diode 1, on the other hand. FIG. 3 makes it possible properly to illustrate the current lines (arrows F2), coming from the second electrode 6 positioned on the second face 4 of the light-emitting diode 1, which pass through the layer 9 of semiconductor material with doping of a first type. These lines have a longer extent than if the second electrode 6 were to be in contact with the thinned part 12. Thus, the position of the first and second electrodes 5, 6 with respect to the thinned part 12 makes it possible to increase the extraction efficiency of the LED (more photons are able to escape from the light-emitting diode by way of the combination of the thinned part with the adapted position of the first and second electrodes).

Preferably, as illustrated in FIGS. 1 to 4, the second electrode 6 is positioned, that is to say formed, on the second face 4, notably at the periphery of the aperture 11a of the recess 11. The second electrode 6 may, for example, take the form of a closed electrically conductive track. With this arrangement, the second electrode 6 is notably located at a distance from the emission surface of the stack, or the second electrode 6 and the emission surface are arranged such that there is contact, or an interface, between the second electrode 6 and a peripheral edge of the emission surface. In FIG. 1, the second electrode 6 is positioned on a zone of the stack 2 that is associated with a part of the stack 2 that is not thinned, such that the current coming from the second electrode 6 is able to be distributed homogeneously in the part 8a of the active region 8 located in the thinned part 12 of the stack 2. The second electrode 6 extends notably on the second face 4 from an edge of the aperture 11a of the recess 11.

Preferably, the light-emitting diode 1 has a current spreading length and, orthogonally to the stacking direction of the semiconductor layers of the stack 2, the recess 11 has a dimension $d_{ev}$ (visible in FIG. 1), for example a diameter (FIG. 4) or a width, comprised between once and five times the current spreading length of the light-emitting diode 1. This dimension is notably the one separating two sides, facing one another, of the wall 11c of the recess 11 (FIG. 1), in particular when the wall 11c of the recess comprises four sides linked in pairs in the way that is illustrated in FIG. 2. Choosing such a dimension makes it possible to limit current losses in the centre of the light-emitting diode 1 on account of the fact that the current decreases according to an exponential parameter divided by the current spreading length of the light-emitting diode 1. In this sense, the dimension targeted here is notably a maximum dimension of between once and five times the current spreading length of the light-emitting diode 1. This is applicable notably when the second electrode 6 is positioned on the second face 4 at the periphery of the aperture 11a of the recess 11. Generally, the dimensions of the recess 11 that depend on the current spreading length and are given above are notably applicable when the bottom 11b of the recess 11 is located between two planes that are notably parallel and pass through the first electrode 5 (notably through the face 5a of the first electrode 5) and the second electrode 6 (notably through a face of the second electrode 6 in contact with the stack 2), respectively, or, worded another way, when the bottom 11b is located at a level located between the first electrode 5 and the second electrode 6. Thus, a plane passing through the bottom 11b of the recess 11 and orthogonal to the stacking direction of the semiconductor layers of the stack 2 may be located between the first and second electrodes 5, 6, this plane being located at a distance from the first and second electrodes 5, 6.

The current spreading length of the light-emitting diode 1 is a notion known to those skilled in the art. By way of example, the current spreading length $L_s$ of the light-emitting diode 1 may be calculated as follows:

$$L_s = (r_c + \rho_{t1} \times t_{t1} + \rho_{t2} \times t_{t2})^{1/2} \times \left| \frac{\rho_{t1}}{t_{t1}} - \frac{\rho_e}{t_e} \right|^{-1/2}$$

where $\rho_{t1}$ is the resistivity of the layer 9 of semiconductor material with doping of a first type, $\rho_e$ is the resistivity of the first electrode 5, $t_{t1}$ is the maximum thickness of the layer 9 of semiconductor material with doping of a first type, $t_e$ is the thickness of the first electrode 5, $r_c$ corresponding to the sum of the contact resistances between the various materials of the light-emitting diode 1, $\rho_{t2}$ corresponding to the resistivity of the layer 7 of semiconductor material with doping of a second type, $t_{t2}$ corresponding to the thickness of the layer 7 of semiconductor material with doping of a second type. In the formula giving $L_s$, 'x' represents multiplication.

It is understood from what has been described above that the thickness of the thinned part 12 of the stack 2 may be chosen, when the light-emitting diode 1 is operating, to promote constructive interference between the direct electromagnetic waves and the reflected electromagnetic waves emitted from the active region 8 of the stack 2, and to promote interference linked to the optical cavity in the stack 2, which cavity is included in the thinned part 12. To this end, the stack 2 preferably has a first thickness dl (FIG. 1) between its first and second faces 3, 4, termed maximum thickness of the stack, and a second thickness d (FIG. 1) between the bottom 11b of the recess 11 and the first face 3. Of course, the second thickness d is strictly less than the first thickness. The second thickness d satisfies the following equation:
where $$z = k_z \cdot \frac{\lambda}{2n}, \quad d = k_d \cdot \frac{\lambda}{2n}$$

and L being such that $$\frac{\lambda}{2n} \cdot (k_d - k_z) = L,$$

where $k_d > k_z$, $k_d$ and $k_z$ being positive non-zero integers (that is to say other than 0), λ being the main emission wavelength during operation of the light-emitting diode, and n being an optical index of the stack 2 determined at the main emission wavelength. In this case, "." represents the multiplication operator in the equations. Notably, the optical index n may be that of the material that features predominantly in the composition of the transport layers, that is to say of the layers 7, 9 of semiconductor material with doping of a first type and of semiconductor material with doping of a second type. Thus, where applicable, n may be equal to the optical index of GaN or of InP. Alternatively, the optical index n may be an average optical index, determined at the main emission wavelength, of semiconductors used in the stack 2. The optical index is also known under the name 'refractive index', and corresponds to the square root of the dielectric constant of the material under consideration at the optical frequency (the wavelength) under consideration.

Preferably, $k_z$ is strictly greater than 1 and strictly less than 6. Specifically, for a value of $k_z$ below 2, the first electrode 5 would be too close to the active region 8, thereby increasing the probability of 'quenching' (or extinguishing luminescence), that is to say in notably that an exciton is able to recombine in a non-radiative manner in the level continuum of the first electrode 5. With a value of $k_z$ greater than or equal to 6, the layer 7 of semiconductor material with doping of a second type would become too thick, which would have the consequence of causing ohmic losses linked to the transport of charge carriers by the layer 7 of semiconductor material with doping of a second type, on the one hand, and an increase in optical absorption as the semiconductor layers do not have a zero absorption (in particular p-doped GaN whose lattice is strongly altered by the massive introduction of Mg dopant), on the other hand, and therefore of altering the operation of the light-emitting diode 1. Preferably, $k_z$ is such that the layer 7 of semiconductor material with doping of a second type has, within the thinned part 12 of the stack 2, a thickness greater than or equal to 50 nm and preferably strictly less than 200 nm. Moreover, preferably $k_d$ is strictly less than 10, this being explained by the fact that it is desired to minimize optical absorption within the light-emitting diode. In addition, $k_d$ is such that the layer 9 of semiconductor material with doping of a first type has, between the bottom 11b of the recess 11 and a face of the layer 9 of semiconductor material with doping of a first type, which face is oriented towards the layer 7 of semiconductor material with doping of a second type, a thickness greater than or equal to 100 nm. In the event of ambiguity with regard to the choice of $k_d$, it is preferable to opt for the smallest value from those selected beforehand in accordance with the criteria explained above so as to limit optical absorption. In other words, $k_z$ is set to the smallest value that allows a thickness of at least 50 nm to be achieved for the layer of semiconductor material with doping of a second type, and $k_d$ is set to the smallest value that allows a minimum thickness of 100 nm to be achieved in the layer 9 of semiconductor material with doping of a first type in the thinned part of the stack.

It is therefore understood that the choices of value for $k_z$ and $k_d$ have an influence on the thickness of the layer 7 of semiconductor material with doping of a second type, and on the thickness of the layer 9 of semiconductor material with doping of a first type between the active region 8 and the bottom 11b of the recess. To view the influence of the thickness of the layers of semiconductor material with doping of a second type and of semiconductor material with doping of a first type, it is possible to establish, through simulation, a map of the radiance, the unit of which is watts per square metre per steradian ($W \cdot m^{-2} \cdot sr^{-1}$) given as a function of the thickness of the layer 7 of semiconductor material with doping of a second type and as a function of the thickness of the layer 9 of semiconductor material with doping of a first type. Such a simulation is associated with an active region 8 whose structure is fixed, and where applicable with a charge carrier blocking layer interposed between the layer 7 of semiconductor material with doping of a second type and the active region 8 and whose features are also fixed. With such a map, it is possible to see pairs of thickness values for which the radiance reaches optimum values. It is also seen that the choice of a pair of values $k_z$ and $k_d$, depending on the choice constraints given above, corresponds to a pair of thickness values adapted to the layers 7, 9 of semiconductor material with doping of a second type and of semiconductor material with doping of a first type.

Notably (FIG. 1), the thinned part 12 of the stack 2 comprises a first part linking the first electrode 5 to a zone (also called internal zone of the stack 2) located in the active region 8 of the stack 2. The first part has a thickness equal to z obtained using the calculations outlined above. The first part comprises notably a portion of the layer 7 of semiconductor material with doping of a second type. The thinned part 12 also comprises a second part extending from the first part to the bottom 11b of the recess 11; the second part has a thickness equal to L obtained using the calculations mentioned above.

In particular, as illustrated in FIG. 1, the first part of the thinned part 12 of the stack 2 comprises at least one portion 70 of the layer 7 of semiconductor material with doping of a second type whose thickness corresponds to the thickness of the layer 7 of semiconductor material with doping of a second type within the thinned part 12. The first part of the thinned part 12 of the stack 2 may also, where applicable, comprise a portion 100 of the charge-carrier blocking layer 10 whose thickness corresponds to the thickness of the charge-carrier blocking layer 10 within the thinned part 12.

The first part of the thinned part 12 of the stack 2 may also comprise a portion 80a of the active region 8 whose thickness is strictly less than the thickness of the active region 8 within the thinned part 12.

In particular, as illustrated in FIG. 1, the second part of the thinned part 12 comprises, relative to its thickness, at least one portion 90 of the layer 9 of semiconductor material with doping of a first type, the thickness of the portion 90 of the layer 9 of semiconductor material with doping of a first type corresponding to the distance separating the face of the layer 9 of semiconductor material with doping of a first type, which face is oriented towards the active region 8 (or towards the layer 7 of semiconductor material with doping of a second type) of the bottom 11b of the recess 11. Moreover, the second part of the thinned part 12 of the stack 2 may also comprise a portion 80b of the emissive region 8 that is separate from the portion 80a of the emissive region 8 that the first part contains.

The active region 8 may be formed by a p-n junction, or be in a single layer (p-i-n junction), or may comprise a plurality of active layers each forming a quantum well and separated pairwise by a cladding layer. The structure of the active region 8 depends on the main emission wavelength desired for the light-emitting diode 1; the implementation of an active region 8 is well known to those skilled in the art. According to one embodiment, the active region 8 comprises a plurality of active layers 8b (FIG. 5)—which therefore belong to the stack of semiconductor layers—each allowing the recombination of charge carriers at least in the part of the active region 8 located in the thinned part of the stack. Each active layer 8b may form a quantum well. The adjacent active layers 8b may be separated by a cladding layer 8c adapted to the active layers that it separates. The active layer 8b closest to the layer 9 of semiconductor material with doping of a first type may be linked to said layer 9 of semiconductor material with doping of a first type by an additional cladding layer 8d. The active layer 8b closest to the first electrode may be in contact either with the blocking layer 10, if it is present, or with a corresponding cladding layer. Each active layer 8b may have a thickness comprised between 1 nm and 8 nm, and each cladding layer may have a thickness comprised between 3 nm and 15 nm. An active layer may be made of gallium nitride, of aluminium gallium nitride, or of gallium indium nitride, the atomic percentages of the compounds of which may be adjusted depending on the materials used in the transport layers or the cladding layers. The cladding layers may be: made of $In_xGa_{1-x}N$ if the quantum well is made of $In_yGa_{1-y}N$ where x<y, x being able to be equal to 0, or made of $Al_xGa_{1-x}N$ if the quantum well is made of $Al_yGa_{1-y}N$ where x>y, y being able to be equal to 0.

Figure 5:
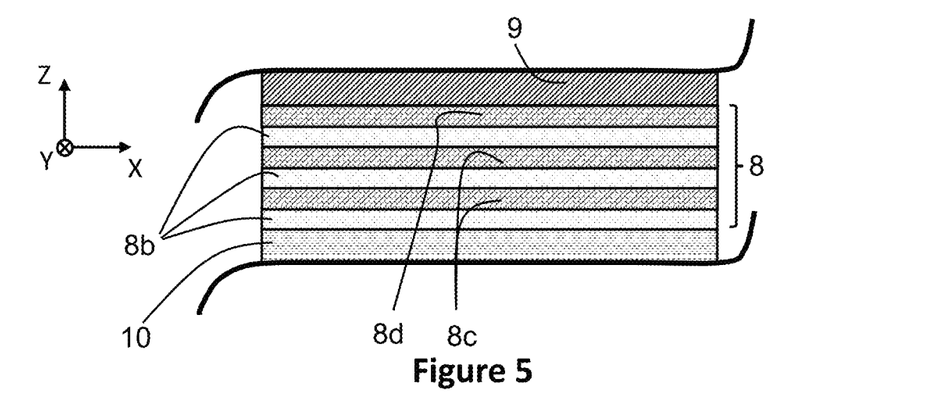
FIG. 5 is a sectional illustration of some of the layers of the stack of the light-emitting diode.
Figure 6:
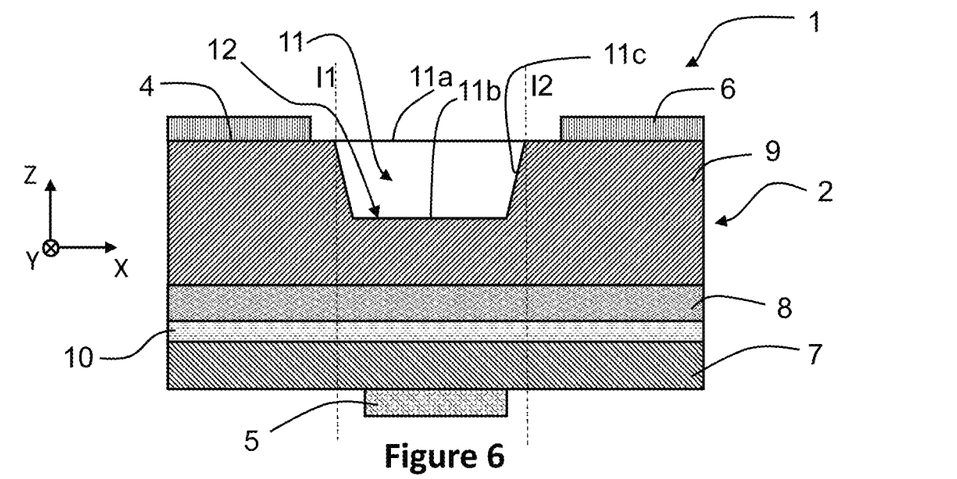
FIGS. 6 to 10 are sectional views of various embodiments of the light-emitting diode,
FIG. 11 schematically illustrates steps of a method for developing the light-emitting diode.

In the example in which the active region 8 comprises a plurality of active layers each allowing the recombination of charge carriers, the zone located in the active region 8 is located in the active layer 8b allowing the recombination of charge carriers that is closest to the first electrode 5. This makes it possible, in correspondence with the values of z and L, to optimize the thickness of the thinned part. In this sense, the zone located in the active region 8 is preferably located in a median plane, orthogonal to the direction in which the thickness of the active layer is measured, of said active layer 8b closest to the first electrode 5.

According to one particular implementation in which the active region 8 comprises a plurality of active layers each forming a quantum well, the emission source of the photons is not located at one point, nor in one plane, but, by contrast, in a plurality of wells, that is to say a plurality of planes arranged in the active region 8 of the stack 2. To optimize such a light-emitting diode structure, it would be possible for example to take into account the various layers forming the quantum wells as independent point sources. Next, it would be necessary to sum the results in order to optimize the thickness of the optical cavity, that is to say of the stack of layers between the first electrode and the bottom of the recess, by adjusting the thickness of the portion of the layer of semiconductor material with doping of a second type that is present in the thinned part of the stack, and adjusting the thickness of the portion of the layer of semiconductor material with doping of a first type that is present in the thinned part of the stack.

However, in particular in the case of an LED based on GaN, InGaN or AlGaN, the first electrode 5 is an anode, and the reasoning behind the independent point sources may be simplified as follows: as the mobility of the electrons is greater than that of the holes, the majority of the recombinations within the active region 8 will occur in the layer, forming the quantum well, closest to the first electrode 5. It is in this sense that the first part of the thinned part 12 of the stack 2 preferably extends from the part 13 of the first face 3 to the zone located in the active region 8 mentioned above. Said zone located in the active region 8 is then preferably located at the median of the layer, relative to its thickness, forming the quantum well, closest to the first electrode 5. It is then said that the first part of the thinned part of the stack 2 comprises the portion of the layer 7 of semiconductor material with doping of a second type and a section/portion of the layer, forming a quantum well, closest to the anode 5. In the particular case of an LED based on InP, it is the holes that are more mobile than the electrons; it is for this purpose that the above reasoning is reversed, considering the first electrode to be a cathode.

According to one embodiment, the shape of the recess 11 may also contribute to improving the efficiency of the light-emitting diode 1, taking into account the current spreading length of the light-emitting diode 1.

In FIG. 1, the sides of an etch delimiting the thinning of the layer 9 of semiconductor material with doping of a first type are shown at right angles with respect to the bottom 11b. However, this is not an essential feature of the invention, since the wall 11c of the recess 11 may be formed by sides that are preferably angled, then forming a trapezium (FIG. 6) whose smaller base is proximal to the active region 8 and such that the area of the bottom 11b of the recess 11 is strictly smaller than the area of the aperture 11a of the recess 11: with such an arrangement, the distribution of the current is facilitated, notably when the second electrode 6 is formed on the second face 4. However, it is also possible to imagine a wall 11c comprising one or more concave (FIG. 7) or convex sides, or a wall 11c whose sides are angled (FIG. 8) so as to form a narrowing of the recess 11 at the aperture 11a of the recess 11 at the top of the light-emitting diode 1, so as to form a diaphragm that limits the emission cone of the light-emitting diode 1.

Figure 8:
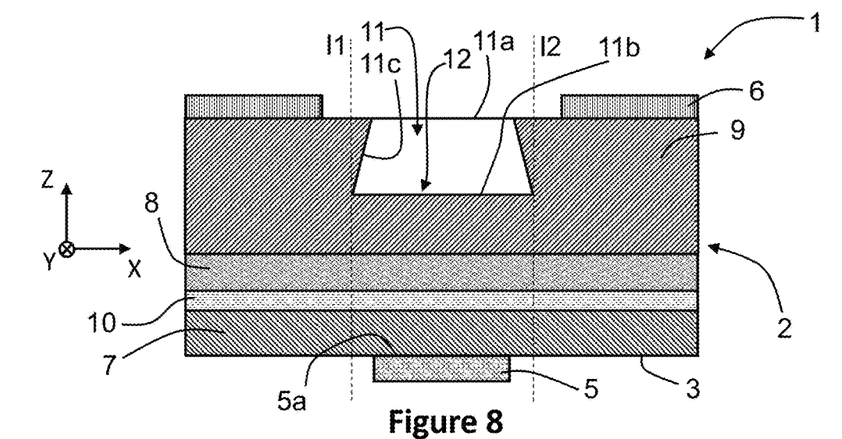

FIG. 8 shows one implementation in which the aperture 11a of the recess has dimensions smaller than the dimensions of the recess 11 as measured in a plane located between the aperture 11a of the recess and the bottom 11b of the recess 11, this plane being notably parallel to the planes of the layers of the stack 2. Worded another way, the area of the bottom 11b is in this case strictly greater than the area of the aperture 11a of the recess. In this case, the photons will preferably have to pass through the aperture 11a of the recess 11. In this sense, the aperture 11a of the recess 11 has an area greater than or equal to the area of said face 5a of the first electrode 5 in contact with the first face 3 of the stack. In this case, preferably, the face 5a of the first electrode 5 is oriented towards the aperture 11a of the recess 11; it is said notably that the aperture 11a of the recess is located above, or plumb with, the first electrode 5 then located at the bottom part of the light-emitting diode 1. In this sense, as the face 5a of the first electrode 5 is planar, any point of the face 5a of the first electrode 5 oriented towards the active region 8 may be associated with a straight line passing through this point and that is orthogonal to said face 5a of the first electrode 5, said straight line passing through the aperture 11a of the recess 11. This makes it possible to improve the distribution of the current within the light-emitting diode 1 for the desired application. Moreover, such an implementation makes it possible to control the beam emitted by the light-emitting diode 1 on the side where the second electrode 6 is located.

Figure 7:
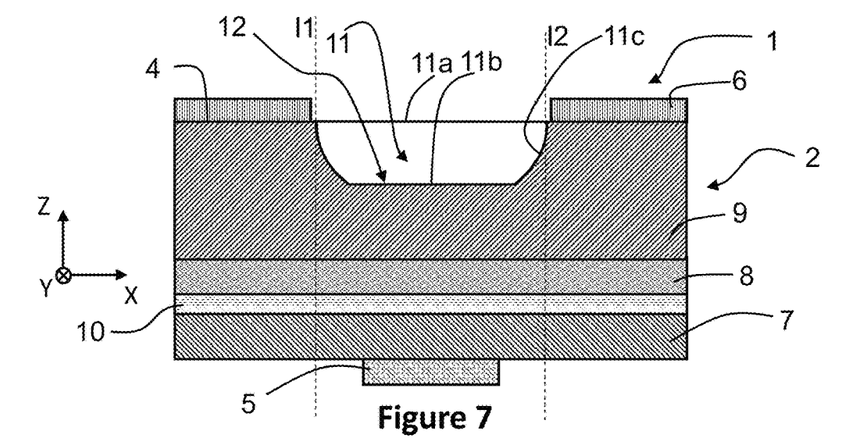

To optimize the spatial distribution of the current during operation of the light-emitting diode 1, preferably when the second electrode 6 is positioned/formed on the second face 4 (FIG. 7), the wall 11c of the recess 11 that links the bottom 11b of the recess to the aperture 11a of the recess 11 is such that it has a profile linking a point of the aperture 11a of the recess 11 to a point of the bottom 11b of the recess 11. Said profile is notably taken along a sectional plane orthogonal to the layers of the stack 2 and notably to the bottom of the recess 11. The shape of this profile is preferably an exponential dependent on the current spreading length of the light-emitting diode 1. In particular, this shape taken in a plane parallel to the plane ZX is of the type $$f(x) = 1 \cdot e^{\left(\frac{-x}{Ls}\right)}$$

for the left-hand part of the wall of the recess of FIG. 7 and of the type $$f(x) = 1 \cdot e^{\left(\frac{x}{Ls}\right)}$$

for the right-hand part of the wall of the recess of FIG. 7. In other words, the wall 11c of the recess 11 may be concave, that is to say that it may comprise, in a sectional plane perpendicular to the bottom 11b of the recess 11, a concave profile, preferably representative of an exponential function dependent on the current spreading length Ls of the light-emitting diode 1. This profile links, in the sectional plane, a point of the aperture 11a of the recess 11 to a point of the bottom 11b of the recess 11. According to one embodiment in which the aperture of the recess is circular, the wall of the recess may be delimited by a surface of revolution obtained by rotating a planar curve whose equation is representative of an exponential dependent on the current spreading length of the light-emitting diode. The planar curve is rotated about an axis parallel to the axis Z and that passes through the bottom of the recess.

The recess 11 may have a depth corresponding to a value comprised between 2% and 98% of the maximum thickness of the layer 9 of semiconductor material with doping of a first type. Notably, according to the example illustrated in FIGS. 1 and 6 to 8, the thickness of the layer 9 of semiconductor material with doping of a first type between the second electrode 6 and the face of the layer 9 of semiconductor material with doping of a first type, which face is oriented towards the layer 7 of semiconductor material with doping of a second type, may be comprised between 1 µm and 10 µm. Below 1 µm, the current spreading length of the light-emitting diode will impose a first electrode 5 that is too small for the emission surface of the light-emitting diode to be correct, and above 10 µm, the price of the light-emitting diode will be too high. For the rest of the stack 2, the thicknesses will be chosen depending on the optical index, on the main emission wavelength and also on the values $k_d$ and $k_z$. Generally, an attempt will be made to keep a maximum thickness for the stack 2 comprised between 1 µm and 800 µm.

Figure 11:
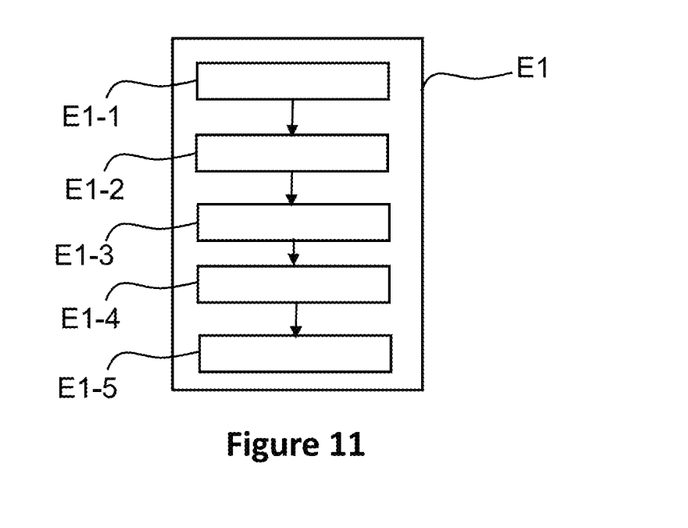

It is understood from what has been described above that the invention also relates to a method (FIG. 11) for developing a light-emitting diode 1 such as described, that is to say that said light-emitting diode 1 to be developed comprises the stack of semiconductor layers comprising the first face 3 and the second face 4 that are opposite one another relative to the thickness of the stack 2. The development method is implemented notably for the purpose of subsequently manufacturing said light-emitting diode such as developed. The advantages linked to the development method are derived from those described in the context of the light-emitting diode 1 for the purpose of manufacturing it so that it has the desired advantages. The light-emitting diode 1 to be developed also comprises the first electrode 5 comprising the face 5a in contact with the first face 3 of the stack 2, and the second electrode 6. In this case, the development method comprises a step E1 of designing the stack 2 whose second face 4 has the recess (which is then formed in the second face 4) so as to form the thinned part 12 of the stack 2. This step E1 of designing takes into account the following features:

said face 5a of the first electrode 5 of the light-emitting diode 1 is intended to be in contact only with the thinned part 12 of the stack 2, the second electrode 6 of the light-emitting diode 1 is intended to be in contact with a zone of the stack separate from said thinned part 12 of the stack 2.

It is understood that the design step E1 makes it possible to implement the development of the light-emitting diode 1.

In particular, step E1 of designing the stack 2 comprises the following steps:

a step E1-1 of determining the main emission wavelength λ of the light-emitting diode during operation thereof, a step E1-2 of determining, at the main emission wavelength, the optical index n of the stack 2, notably such as described above, a step E1-3 of determining the thickness d of the thinned part 12 between the first face 3 and the bottom 11b of the recess 11, the thickness d satisfying d=Z+L where $$z = k_z \cdot \frac{\lambda}{2n}, \quad d = k_d \cdot \frac{\lambda}{2n}$$

and L being such that $$\frac{\lambda}{2n} \cdot (k_d - k_z) = L$$

where $k_d > k_z$, $k_d$ and $k_z$ being positive integers other than 0.

Notably, the step E1-3 of determining the thickness d comprises a step of choosing the value of $k_z$, $k_z$ having to be strictly greater than 1 and strictly less than 6, and a step of choosing the value $k_d$, $k_d$ having to be strictly less than 10.

All of the constraints linked to the values of $k_z$ and $k_d$ and described in combination with the light-emitting diode may be applied to the development method.

Steps E1-1 to E1-3 make it possible notably to determine the maximum thickness of the stack 2, and to determine the various semiconductor layers of which it has to consist.

Moreover, the step E1 of designing the stack 2 may comprise a step E1-4 of determining the current spreading length of the light-emitting diode 1. The design step E1 also comprises a step E1-5 of dimensioning the recess 11 such that, orthogonally to a stacking direction of the semiconductor layers of the stack 2, said recess 11 has a dimension (for example a diameter, a width), notably a maximum dimension, comprised between once and five times the current spreading length of the light-emitting diode 1.

In particular, everything that has been described in the context of the light-emitting diode 1 may also be applied in the context of the development method. In this case, the design step E1 may also take into account the fact that the stack 2 will have to comprise, for its thinned part 12, the first and second parts described above.

The invention may also relate to a method for manufacturing a light-emitting diode 1 such as described, comprising a step of developing the light-emitting diode 1 implementing the method for developing the light-emitting diode 1, and a step of manufacturing the light-emitting diode 1 according to the results of the step of developing the light-emitting diode 1.

One specific example of a light-emitting diode is given hereinafter in which the stack is based on GaN, that is to say in which the material of the layers of material with doping of a first type (n-doping) and of a second type (p-doping) is GaN. In this case, the optical index n is equal to 2.49 for a main emission wavelength of 450 nm during operation of the light-emitting diode. In this stack, there are arranged, between the layer of semiconductor material with doping of a second type and the layer of semiconductor material with doping of a first type, the following successive layers: an electron blocking layer made of AlGaN and at least one layer forming a quantum well with a thickness equal to 10 nm and made of InGaN. According to this example, we then get $$\frac{\lambda}{2n} \sim 90 \text{ nm.}$$

In this example, z represents the thickness of the first part of the thinned part of the stack, and corresponds to the sum of the thicknesses of the layer of semiconductor material with doping of a second type, of the electron blocking layer, and of half the thickness of the quantum well closest to the blocking layer. Thus, for an emission at a wavelength of 450 nm, $k_z=2$ will be opted for as a priority, hence z=90*2=180 nm, that is to say a thickness of the layer of p-doped material of the order of 150 nm if the thickness of the blocking layer is 25 nm and the thickness of a quantum well is of the order of 10 nm. The value $k_d$ is then chosen so as to allow formation of the rest of the layers composing the active region and the layer of semiconductor material with doping of a first type whose thickness is at least 100 nm.

In the present description, 'of the order of' is understood to mean to within 10%.

Figure 9:
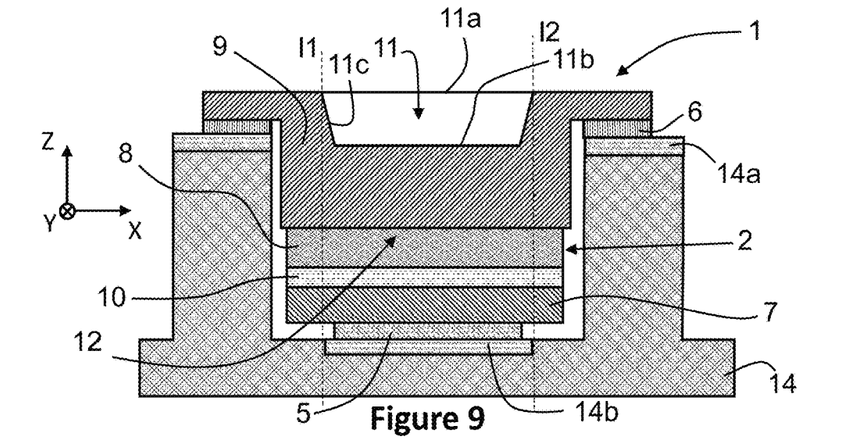
Figure 10:
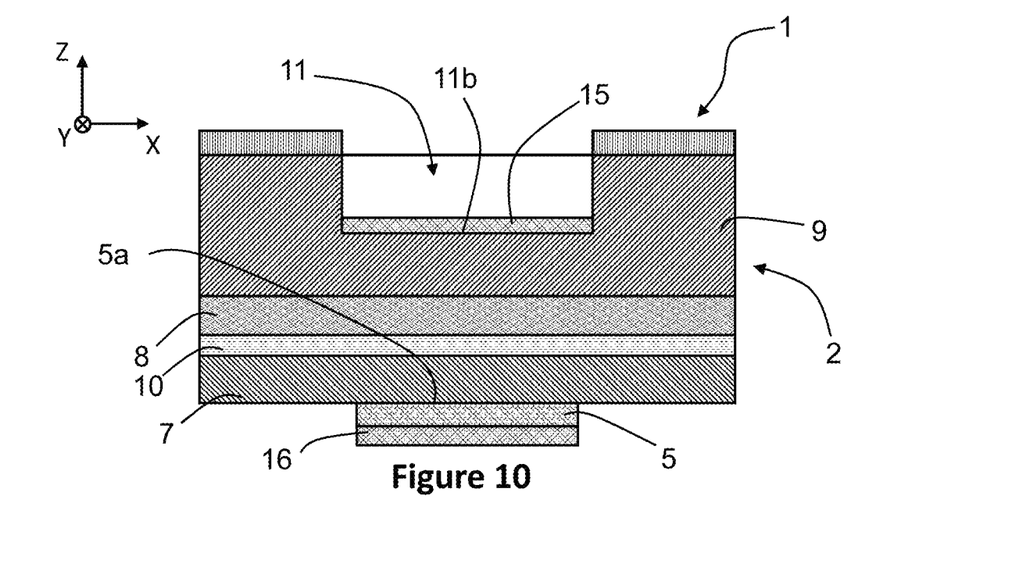

The architecture of the light-emitting diode illustrated in FIG. 1 corresponds notably to a diode with a thin film configuration, better known in the field under the abbreviation VTF for 'vertical thin film'. However, the invention may also be applied to other structures, such as for example the one illustrated in FIG. 9 with a TFFC (abbreviation for 'thin film flip chip') structure, in which the first electrode 5 and the second electrode 6 are accessible from one and the same side of the light-emitting diode 1, the thinned part 12 of the stack 2 being shown between the dashed lines 11 and 12. In FIG. 9, a substrate 14 is shown onto which the light-emitting diode 1 is transferred after it has been formed on a sacrificial substrate that is not visible in FIG. 9 as it has been removed so as to allow the recess 11 to be formed. The substrate 14 therefore comprises connection terminals 14a, 14b that each come into contact with one of the corresponding first and second electrodes 5, 6. As mentioned above, the level of the bottom 11b is lower than the level of the second electrode 6 in FIG. 9 (that is to say that the level of the bottom 11b is located between the level of the first electrode 5 and the level of the second electrode 6) so as to satisfy the conditions linked to the current spreading length with respect to the lateral dimensioning of the recess 11.

Generally, the lines 11 and 12 shown in FIGS. 1 and 6 to 9 virtually represent limits of the thinned part 12 of the stack 2 in contact with the first electrode 5 and make it possible to view the recess 11, the bottom 11b, the aperture 11a and the wall 11c. In FIGS. 1 to 3 and 6 to 10, the stack 2 that is illustrated comprises the layer 7 of material with doping of a second type, the layer 9 of material with doping of a first type, the active region 8, and the blocking layer 10 of the light-emitting diode 1.

The light-emitting diode described above is intended to emit electromagnetic radiation, that is to say photons, when it is operating. The operating wavelength of the diode is not limited to the visible wavelengths. Specifically, those skilled in the art may adjust the stack so as to center the emission of the light-emitting diode on a wavelength outside of the visible.

The light-emitting diode may also comprise at least one Bragg mirror. The structure of a Bragg mirror is known and will not be described in detail here. For example, the light-emitting diode 1 may comprise (FIG. 10) a Bragg mirror 15 arranged in the recess 11, for example at least on the bottom 11b of the recess 11, such that the Bragg mirror is in contact with the layer 9 of semiconductor material with doping of a first type. The position of the Bragg mirror 15 in the recess 11 makes it possible to promote direct emission of the light-emitting diode 1. As an alternative to or in combination with the Bragg mirror arranged in the recess 11, the light-emitting diode 1 may also comprise a Bragg mirror 16 arranged on the first electrode 5, notably on a face of the first electrode opposite the face 5a of the first electrode 5 in contact with the stack 2 and oriented towards the active region 8. The arrangement of the Bragg mirror 16 in contact with the first electrode 5 makes it possible to return photons reaching the first electrode 5 to the recess 11. The Bragg mirror 16 is used notably if the first electrode 5 is transparent or semitransparent. The Bragg mirrors make it possible to increase the reflectivity of the light-emitting diode at the interface where they are located, and therefore to increase the intensity of the constructive interference.

The light-emitting diode described according to the present invention furthermore makes it possible to promote directive emission of photons, even if the Bragg mirror(s) mentioned above are not present.

Moreover, the light-emitting diode may also comprise any device that makes it possible to improve the reflectivity of the interface of the stack with the first electrode or of the air/semiconductor interface by forming, for example, a Bragg mirror as mentioned above or photon crystals made of semiconductor material in the recess, notably on the bottom of the recess. According to another example, at least the bottom of the recess may be coated with a layer (forming a 'capping layer') of material having a refractive index higher than the optical index of the material used to form the layer 9 of semiconductor material with doping of a first type.

The present invention may have applications in industry, such as in lighting, or in displays, where a light-emitting diode such as described is able to be used.

In particular, the present invention is very particularly suitable for forming an array of light-emitting diodes that is dedicated to displays or to viewing, as contrast is increased. Notably, when, for each light-emitting diode, the cathode is formed on the second face of the stack and completely or partly surrounds the aperture of the recess, this makes it possible to avoid crosstalk.

Generally, to increase the contrast of a light-emitting diode when the cathode is located on the second face of the stack, a layer of chromium may be arranged on the cathode such that the cathode is situated between the layer of chromium and the layer of semiconductor material with doping of a first type.

Another advantage of the present invention is that such a diode is able to be manufactured while at the same time limiting the number of masks that are necessary on account of the possibility of aligning the anode, more generally the first electrode 5, with the recess. Moreover, one and the same mask may be used to produce the cathode, more generally the second electrode, and the recess.

The invention claimed is:
1. A light-emitting diode comprising:
a stack of semiconductor layers comprising a first face and a second face (4) that are opposite one another relative to a thickness of the stack (2),
a first electrode comprising a face in contact with the first face of the stack, and
a second electrode in contact with the stack,
wherein a recess is formed in the second face of the stack which results in the stack comprising a thinned part, the face of the first electrode in contact with the first face being in contact only with the thinned part of the stack, the second electrode being in contact with a zone of the stack separate from said thinned part of the stack, and
wherein the stack has a first thickness between its first and second faces and a second thickness d between a bottom of the recess and the first face, the second thickness d being strictly less than the first thickness, the second thickness d satisfying the following equation:

$$d = z + L$$

where $$z = k_z \cdot \frac{\lambda}{2n}, \quad d = k_d \cdot \frac{\lambda}{2n},$$

and L being such that $$\frac{\lambda}{2n} \cdot (k_d - k_z) = L$$

where $k_d > k_z$, $k_d$ and $k_z$ being positive integers other than 0, $\lambda$ being a main emission wavelength during operation of the light-emitting diode, and n being an optical index of the stack (2) determined at the main emission wavelength.

2. The light-emitting diode according to claim 1, wherein the recess delimits said thinned part of the stack with a part of the first face, and wherein the face of the first electrode in contact with the thinned part of the stack has an area smaller than or equal to the area of said part of the first face.

3. The light-emitting diode according to claim 1, wherein the stack comprises an active region able to generate photons, a layer of semiconductor material with doping of a first type and a layer of semiconductor material with doping of a second type, the recess being formed in the layer of semiconductor material with doping of a first type that has an electrical conductivity strictly greater than the electrical conductivity of the layer of semiconductor material with doping of a second type.

4. The light-emitting diode according to claim 3, wherein $k_z$ is strictly greater than 1 and strictly less than 6, $k_d$ is strictly less than 10, and wherein $k_z$ is such that the layer of semiconductor material with doping of a second type has, within the thinned part, a thickness greater than or equal to 50 nm, and wherein $k_d$ is such that the layer of semiconductor material with doping of a first type has, between the bottom of the recess and a face of said layer of semiconductor material with doping of a first type, which face is oriented towards the layer of semiconductor material with doping of a second type, a thickness greater than or equal to 100 nm.

5. The light-emitting diode according to claim 3, wherein the thinned part of the stack comprises:
 a first part linking the first electrode to a zone located in the active region of the stack, the first part having a thickness equal to z, and
 a second part extending from the first part to the bottom of the recess, the second part having a thickness equal to L.

6. The light-emitting diode according to claim 5, wherein the active region comprises a plurality of active layers each allowing the recombination of charge carriers, and wherein the zone located in the active region is located in the active layer closest to the first electrode.

7. The light-emitting diode according to claim 1, wherein the recess is delimited by an aperture of the recess, which aperture is formed in the second face, a bottom of the recess and a wall of the recess linking the bottom to the aperture.

8. The light-emitting diode according to claim 7, wherein the aperture has dimensions smaller than the dimensions of the recess as measured in a plane located between the aperture and the bottom of the recess, and wherein the aperture has an area greater than or equal to that of said face of the first electrode.

9. The light-emitting diode according to claim 7, wherein the wall comprises, in a sectional plane perpendicular to the bottom, a concave profile.

10. The light-emitting diode according to claim 1, comprising a current spreading length and wherein, orthogonally to a stacking direction of the semiconductor layers of the stack, the recess has a dimension comprised between once and five times the current spreading length of the light-emitting diode.

11. A method for developing a light-emitting diode, said light-emitting diode to be developed comprising:
 a stack of semiconductor layers comprising a first face and a second face that are opposite one another relative to a thickness of the stack,
 a first electrode comprising a face in contact with the first face of the stack, and
 a second electrode,
 the development method comprising:
 a step of designing the stack whose second face has a recess so as to form a thinned part of the stack, the step of designing taking into account the following features:
  said face of the first electrode of the light-emitting diode is intended to be in contact only with the thinned part of the stack, and
  the second electrode of the light-emitting diode is intended to be in contact with a zone of the stack separate from said thinned part of the stack,
 wherein the step of designing the stack comprises the following steps:
  a step of determining a main emission wavelength $\lambda$ of the light-emitting diode during operation thereof,
  a step of determining, at the main emission wavelength, an optical index n of the stack, and
  a step of determining a thickness d of the thinned part between the first face and a bottom of the recess, the thickness d satisfying d=z+L where $$z = k_z \cdot \frac{\lambda}{2n}, \quad d = k_d \cdot \frac{\lambda}{2n},$$

and L being such that $$\frac{\lambda}{2n} \cdot (k_d - k_z) = L$$

where $k_d > k_z$, $k_d$ and $k_z$ being positive integers other than 0.

12. The development method according to claim 11, wherein the step of determining the thickness d comprises a step of choosing the value of $k_z$, $k_z$ having to be strictly greater than 1 and strictly less than 6, and a step of choosing the value $k_d$, $k_d$ having to be strictly less than 10.

13. The development method according to claim 11, wherein the step of designing the stack comprises a step of determining a current spreading length of the light-emitting diode, and a step of dimensioning the recess such that, orthogonally to a stacking direction of the semiconductor layers of the stack, said recess has a dimension comprised between once and five times the current spreading length of the light-emitting diode.

\* \* \* \* \*